United States Patent
Simeray et al.

(10) Patent No.: US 6,340,787 B1
(45) Date of Patent: Jan. 22, 2002

(54) POWER CONVERTER FOR SUPPLYING ELECTRICITY FROM A DIFFERENCE IN TEMPERATURE

(76) Inventors: Janick Simeray, 9, rue Paul Bert, F-92700 Colombes; Pascal Laligant, 4, rue Pierre Mendes France, F-60330 Le Plessis Belleville, both of (FR)

(*) Notice: Subject to any disclaimer, the term of this patent is extended or adjusted under 35 U.S.C. 154(b) by 0 days.

(21) Appl. No.: 09/319,128

(22) PCT Filed: Dec. 1, 1997

(86) PCT No.: PCT/FR97/02165

§ 371 Date: Jan. 3, 2000

§ 102(e) Date: Jan. 3, 2000

(87) PCT Pub. No.: WO98/25333

PCT Pub. Date: Jun. 11, 1998

(30) Foreign Application Priority Data

Dec. 2, 1996 (FR) ............................................. 96 14734
Aug. 13, 1997 (FR) ............................................. 97 10338

(51) Int. Cl.⁷ ............................................. H01L 35/34
(52) U.S. Cl. .................... 136/201; 136/203; 136/205; 136/238; 136/239; 136/240; 252/62.37
(58) Field of Search ................. 136/201, 203, 136/205, 204, 238, 239, 240; 252/62.3 T

(56) References Cited

U.S. PATENT DOCUMENTS

| | | | |
|---|---|---|---|
| 3,523,832 A | * 8/1970 | Rupprecht et al. | 136/205 |
| 3,679,918 A | 7/1972 | Keizi | 310/8.1 |
| 3,913,000 A | 10/1975 | Cardwell, Jr. | 321/2 |
| 4,320,477 A | * 3/1982 | Baumgartner | 368/64 |
| 4,465,894 A | 8/1984 | Reyes | 136/225 |
| 4,946,511 A | 8/1990 | Shiloh et al. | 136/212 |
| 5,040,381 A | * 8/1991 | Hazen | 62/3.2 |

FOREIGN PATENT DOCUMENTS

| | | |
|---|---|---|
| DE | 1437235 | 10/1968 |
| FR | 1162168 | 9/1958 |
| FR | 2118658 | 7/1972 |
| FR | 2435132 | 3/1980 |
| GB | 1025687 | 4/1966 |
| GB | 2160358 | 12/1985 |

OTHER PUBLICATIONS

CRC Handbook of Thermoelectrics, Chapter 34, New Materials and Performance Limits for Thermoelectric Cooling, p. 408, 1995 by CRC Press, Inc.*

Wilson P: "V Switching Mode Power Supplies" Semiconductor Circuit Design, No. vol. 4, 1975, pp. 65–67 Norris B.

Butler F: "Transistor Inverter Frequency Stabilized Circuit Suitable for Running a Tape Recorder" Wireless World vol. 67, No. 1/18, Jan. 1961 pp. 18.

Patent Abstracts of Japan vol. 005, No. 078 (E–058), May 22, 1981 &JP 56 025384 (Mar. 11, 1981).

Patent Abstracts of Japan vol. 017, No. 022 (E–1307), Jan. 14, 1993 & JP 04 249385 (Sep. 4, 1992).

* cited by examiner

Primary Examiner—Kathryn Gorgos
Assistant Examiner—Thomas H Parsons
(74) Attorney, Agent, or Firm—Millen, White, Zelano & Branigan, P.C.

(57) ABSTRACT

An energy converting circuit, boosting the voltage supplied by a low direct voltage source, comprising a self-oscillating circuit, operating at very low voltage, using a voltage boosting transformer generating control signals of two chopper-boosters operating alternately. The circuit including an enhancement-type field effect translator used in synchronous switching with the self-oscillating circuit, which is in serial connection with an inductive resistor to the terminals of the source (1). The transistor being connected to a user circuit via a diode (15, 16). The circuit is used in a device for supplying electricity to appliances and by the production of thermal converters for the utilization of low-voltage thermoelectricity, as well as in a method for the manufacture of thermal converters on an industrial scale.

13 Claims, 13 Drawing Sheets

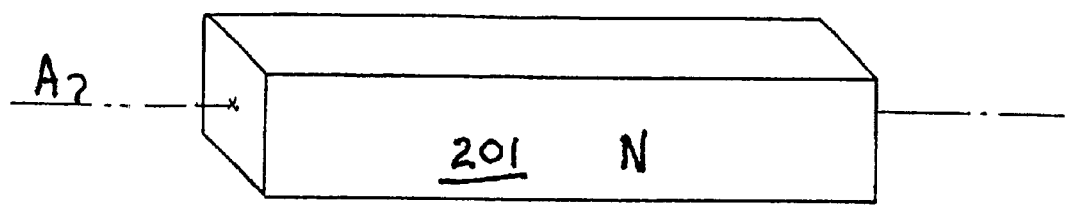
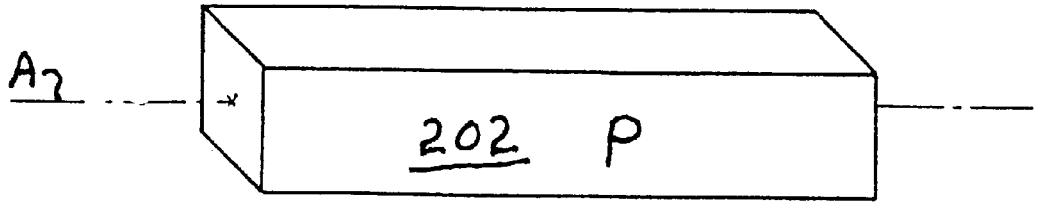
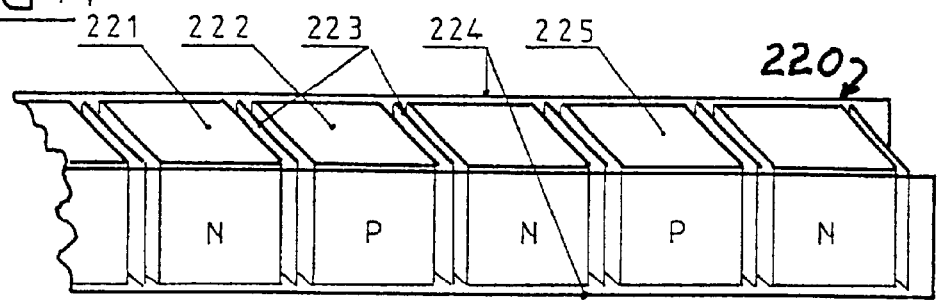
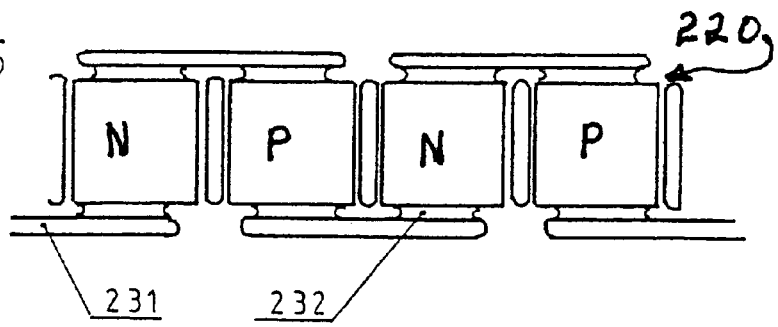
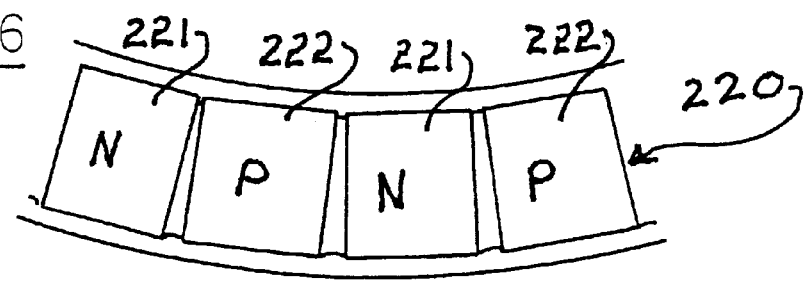

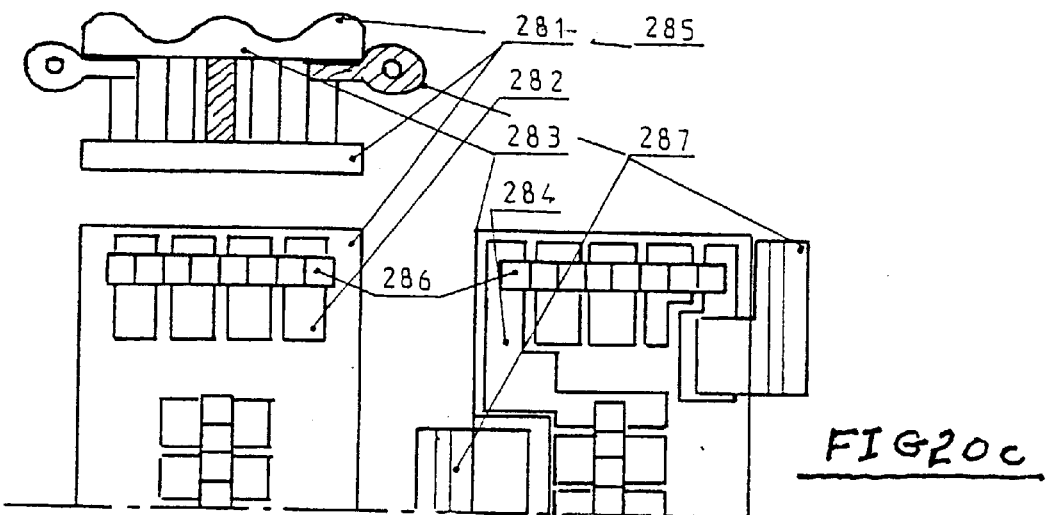
FIG 20a
FIG 20b
FIG 20c
FIG 21
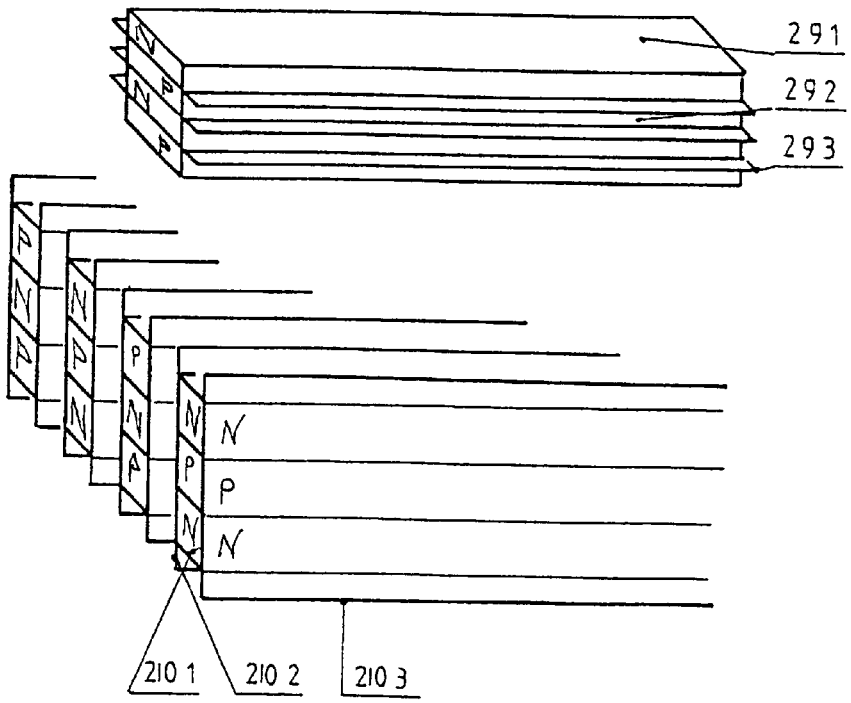
FIG 22

POWER CONVERTER FOR SUPPLYING ELECTRICITY FROM A DIFFERENCE IN TEMPERATURE

FIELD OF THE INVENTION

The present invention concerns an energy converter for feeding an autonomous apparatus with low consumption from thermocouples with a low temperature difference constituting a source of very low voltage and low but not nil internal resistance, the realization of the thermocouples, as well as an industrial manufacture process of the thermocouples.

BACKGROUND OF THE INVENTION

Many apparatuses have to function autonomously, that is to say that they comprise their own power supply. It is the case of portable apparatuses such as watches or auricular amplifiers which can not be permanently connected to an electrical feeding system. It is also the case of apparatuses placed in difficulty accessible places, such as intrusion detectors used in alarm systems; they are placed for example in openings such as windows where it is difficult and expensive to bring a feeding cable.

These autonomous apparatuses with low consumption are currently fed by cells or rechargeable elements whose life or discharge duration is limited, what involves relatively frequent replacement or refill operations and obliges to store piles or accumulators of replacement for avoiding an interruption of the functioning. One has already envisaged to exploit sources of very low voltage by using converters providing an output voltage in the order of some volts for feeding apparatuses with low consumption reduced without interruption of functioning by using a self oscillating circuit comprising a step-up transformer and a field effect transistor whose drain-source path is connected in the primary of the transformer.

These known converters are conceived for oscillating in such a way to increase the voltage and they have a mediocre efficiency which does not allow to extract, from sources of very low voltage, the necessary power for the functioning of a watch or an auditive apparatus. Furthermore, the functioning of these oscillators is strongly disturbed when the load becomes significant; they can stop oscillating or even not start.

We know well documents: 1 (PETER WILSON "V Switching Mode Power Supplies"), 2 (DE 14 37 235 A Philips), 3 (U.S. Pat. No. 3 679 918 A KEIZI), 4 (F. BUTLER "Transistor Inverter Frequency Stabilized Circuit Suitable for Running a Tape Recorder", 5 (Patent Abstracts of JAPAN vol 5, n°78 (E-058)), 7 (FR 1 162 168 A Soci etégenerale d'équipement pour l'automobile, la locomotion aerienne).

All these documents comprise oscillator circuits, the diagrams described in documents 3 and 7 are the closest to the invention, however none of them is able to spontaneously oscillate when the circuit is fed by a direct voltage as low as 10 to 200 millivolts. This is due to the threshold effect occurring in the base-emitter junction of the oscillator transistor (in the order of 0.5 volt). A bipolar transistor has to be polarized for being able to be used in a self oscillating circuit. This is not the case of the JFET transistor used in the present invention, it has a variable resistance when the gate-source voltage Vgs fluctuates around zero volt. The document 1 as well as the document 6 (U.S. Pat. No. 3,913,000 A GILBERT, CARDWELL) show converter circuits using the load of an inductance for converting a voltage, the process is well known as stated in the document 6, FIG. 1. What is new in the framework of the present invention is the association of the self-oscillating circuit and of the chopping converter which is optimized for the very low powers (10 microwatts to 10 milliwatts), without other source of energy for the operation of the converter.

SUMMARY OF THE INVENTION

The basic problem solved by the invention is to provide an energy converting circuit having an efficiency allowing one to extract the desired power and voltage from sources of electrical power of very low voltage and whose functioning is insured even for a significant load. For this purpose, the object of the invention is an energy converting circuit which boosts the voltage provided by a source at low direct voltage with small internal resistance, comprising a self-oscillating circuit, functioning at a very low voltage, using a voltage step-up transformer generating the control signals of two chopper-step-up transformers with alternate operation, of the type comprising an enhancement mode field effect transistor which is used as a synchronous switch with the self-oscillating circuit, which is connected in series with an inductance to the terminals of said source and which is connected to the user circuit through a diode.

The use of chopper-step-up circuits allows to extract approximately 50% of the available power in the source. One can feed apparatuses with a voltage of some volts from a source whose voltage is in the order of some tens of millivolts.

Moreover, the functioning is insured for important loads.

Advantageously, a voltage limiting diode and a condenser of great capacity or an accumulator is connected to the output terminals.

In this manner, the output voltage is determined to the desired value.

The invention has also for object a reversible converter circuit, characterized in that it comprises two converter circuits which are antiparallel connected to the source and bound to the output terminals through four switches which are controlled two by two by two supplementary windings of the transformer of the operating converter and in that each converter comprises a blocking device blocking the other converter when it is operating.

Such circuit allows to extract energy provided by a source whose polarity is variable. The two converters operate alternatively according to the polarity of the source, the operating converter blocking the other converter for avoiding any power loss in the non operating converter.

Advantageously, the blocking device comprises a third supplementary winding of the transformer to whose terminals is connected a rectifier circuit generating a direct voltage blocking the self-oscillating circuit of the non operating converter.

The invention had also for object a device for feeding an autonomous portable apparatus from a thermal system comprising a hot source and a cold source with a low temperature difference between them, such as the epidermis of a human being and the ambient atmosphere, characterized in that it is constituted by a converter circuit in which the electrical source is constituted by an assembly of Seebeck effect detectors connected between the two thermal sources. This converter is also suitable for extracting the power of photovoltaic source.

Such a feeding device can be integrated in a watch or an auditive apparatus. It can also be used for recharging a rechargeable element.

BRIEF DESCRIPTION OF THE DRAWINGS

Others characteristics and advantages of the invention will appear from the following specification, which is illustrative and not at all restrictive, by referring to the joined drawings on which:

FIGS. 13 is a prspective view of bars of N and P material, respectively;

FIG. 14 is a perspective view showing bars of N and P material aligned and interlaced in an alternating array;

FIG. 15 is a side view of bars joined by tracks;

FIG. 16 is a top view showing an element made of bars in a bent configuration;

FIGS. 20a, 20b and 20c are views of a microgenerator in the form of bracelet link;

FIG. 21 is a perspective view showing alternating slices of P and N material;

FIG. 22 is a perspective view showing ingots of material alternating between P and N material;

FIG. 1 is the diagram of a converter circuit intended for extracting the electrical power provided by a source 1 of very low voltage, for example of 10 to 200 mV, that has a minimal internal resistance schematized by 2, providing a much more high voltage, for example a voltage of 2 V for an electronic apparatus. The electrical source 1 is connected on the primary 3 of a step-up transformer 4 by the in termediary of the source-drain path of a n-channel field effect transistor (JFET) 5. The JFET transistor 5 is of the pinch effect type, that is to say that, for a nil gate voltage, its drain source resistance is not infinite but in the order of some ohms and its is pinched when the gate voltage becomes negative.

Figure 1:
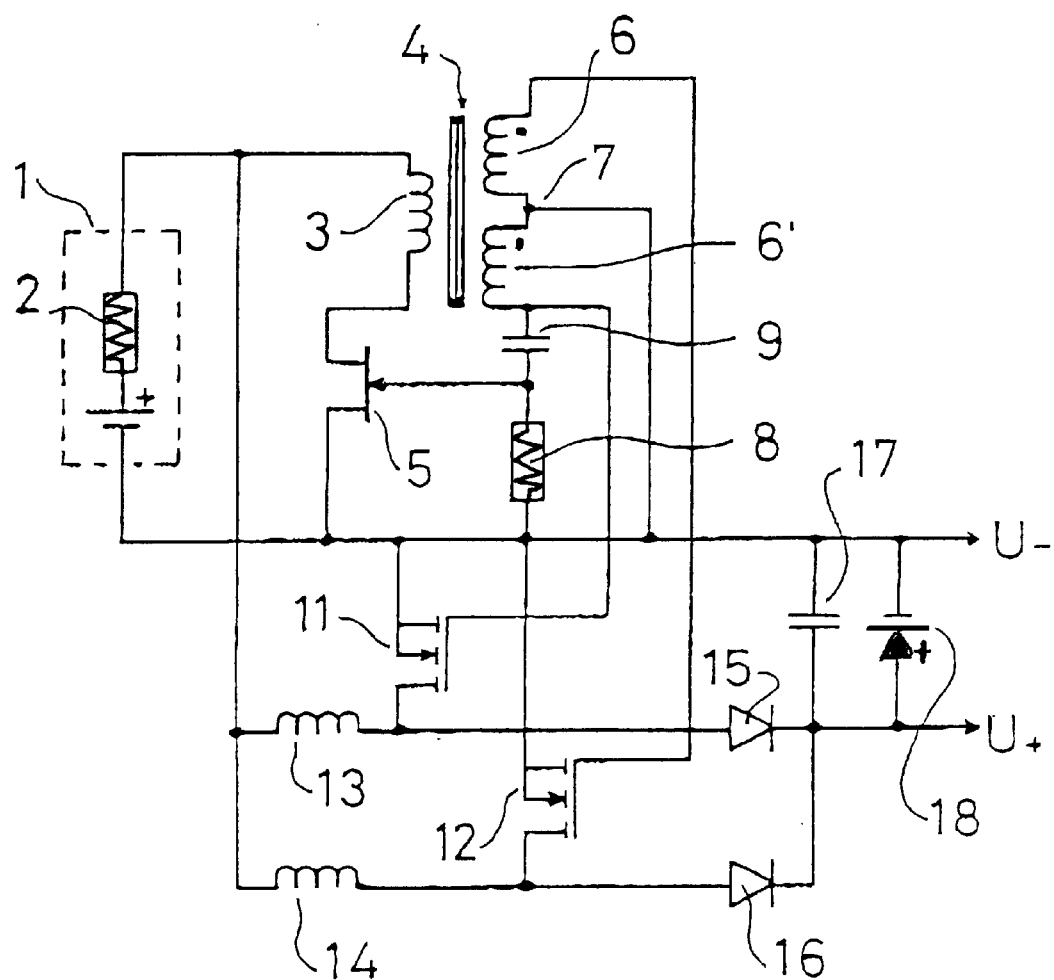
FIG. 1 is the diagram of a converter circuit according to the invention.

The secondary of the transformer 4 comprises two similar windings 6 and 6' connected by a mid-point 7 connected to the ground. The gate of the JFET transistor 5 is connected to the ground by a resistance 8 and the secondary 6' by a condenser 9.

When the gate voltage varies, that involves a variation of the drain-source resistance and, as a result, a variation of the current in the primary 3 which creates a high voltage on the secondary 6' of the transformer 4. The frequency of this oscillation depends on the inductance of the transformer 4, the distributed capacity of the secondary 6 and 6' and the gate-source capacity of the JFET transistor 5. The condenser 9 realizes a galvanic decoupling of the gate and allows the oscillator to consume very few energy, due to the P N gate-source junction.

In accordance with the invention, one uses, for each half-wave of the oscillation, a circuit of the type chopper-step-up transformer comprising transistors 11 and 12 of the n-channel enhancement mode MOS-FET type, whose gate-source voltage threshold is low (for example, 1 to 3 V), an inductance 13, respectively 14, and a Schottky diode 15, respectively 16. Each MOS-FET transistor 11, respectively 12, is connected in series with the inductance 13, respectively 14, and their gates are controlled by the secondary 6', respectively 6 of the transformer 4 whose outputs are crossed in such a way that the gate voltages of both MOS-FET transistors 11 and 12 are in opposition of phase.

Each Schottky diode 15 and 16 is connected between the drain of the MOS-FET transistor and the positive output pole. A condenser 17 of very high capacity and a voltage limiting diode I are in parallel on the output terminals of the converter.

Both these elements are used for determining the value of the output voltage; they can be replaced by a rechargeable element.

The functioning of this converter circuit is illustrated by the diagrams of FIGS. 3a to 3f which represent respectively the voltages of the secondary 6 and 6', the current in one of the inductance's, the drain-source voltage of one of the transistors, the current in the other inductance, the drain-source voltage of the other transistor and the voltage of the source 1. When the gate voltage of the transistor 12 is positive and higher than the threshold, Vs, this transistor is conducting, the inductance 14 progressively accumulates energy as long as the circulating current increases while the voltage on the terminals of the source 1 decreases in a quasi linear manner. When the gate voltage decreases back under the threshold, the transistor 12 is blocked and the energy stored in the inductance 14 is transferred to the positive output terminal by the diode 16. For the next half wave, the transistor 11 loads the inductance 13 that unloads then on the output.

Figure 2:
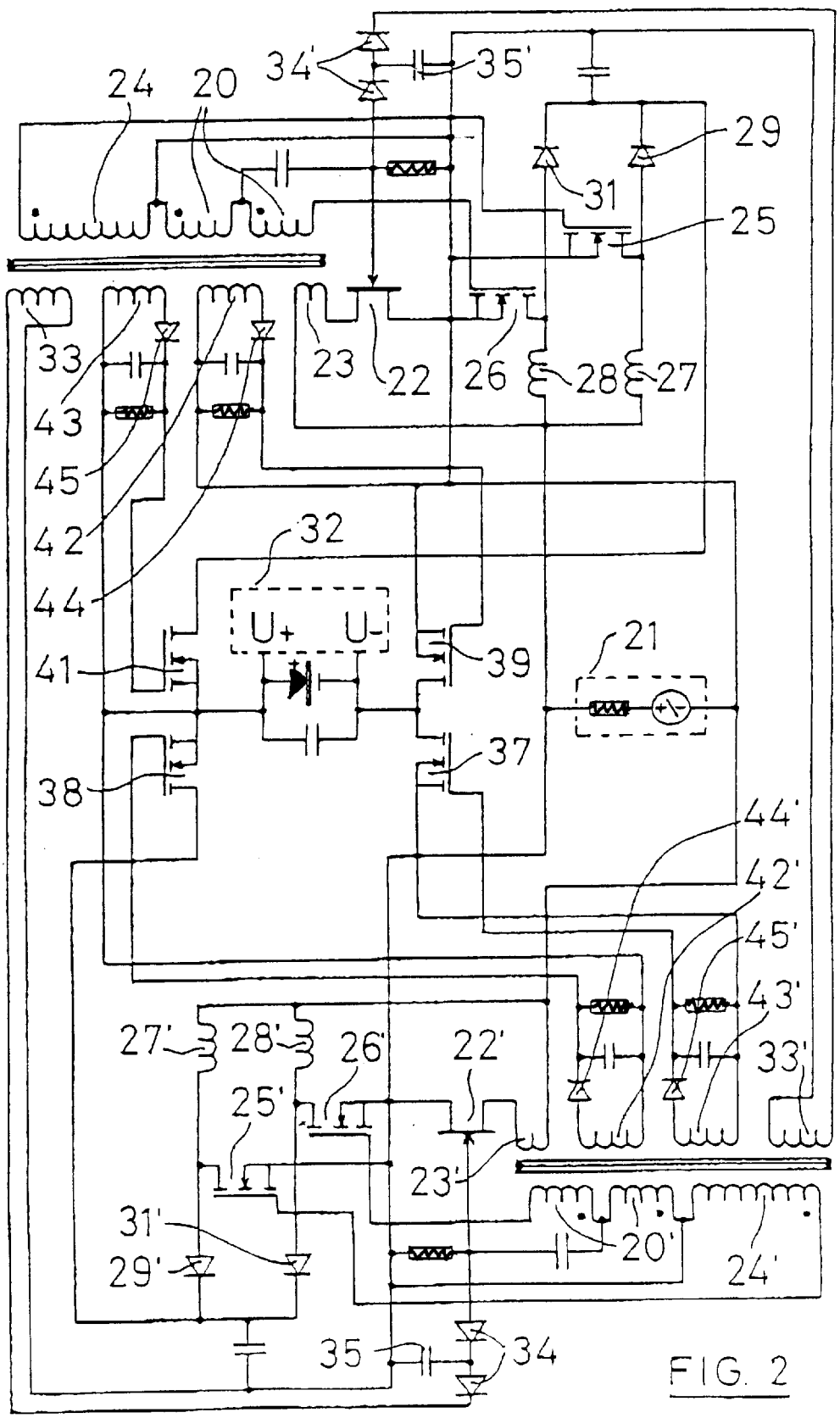
FIG. 2 is the diagram of a reversible converter circuit according to the invention.
Figure 3:
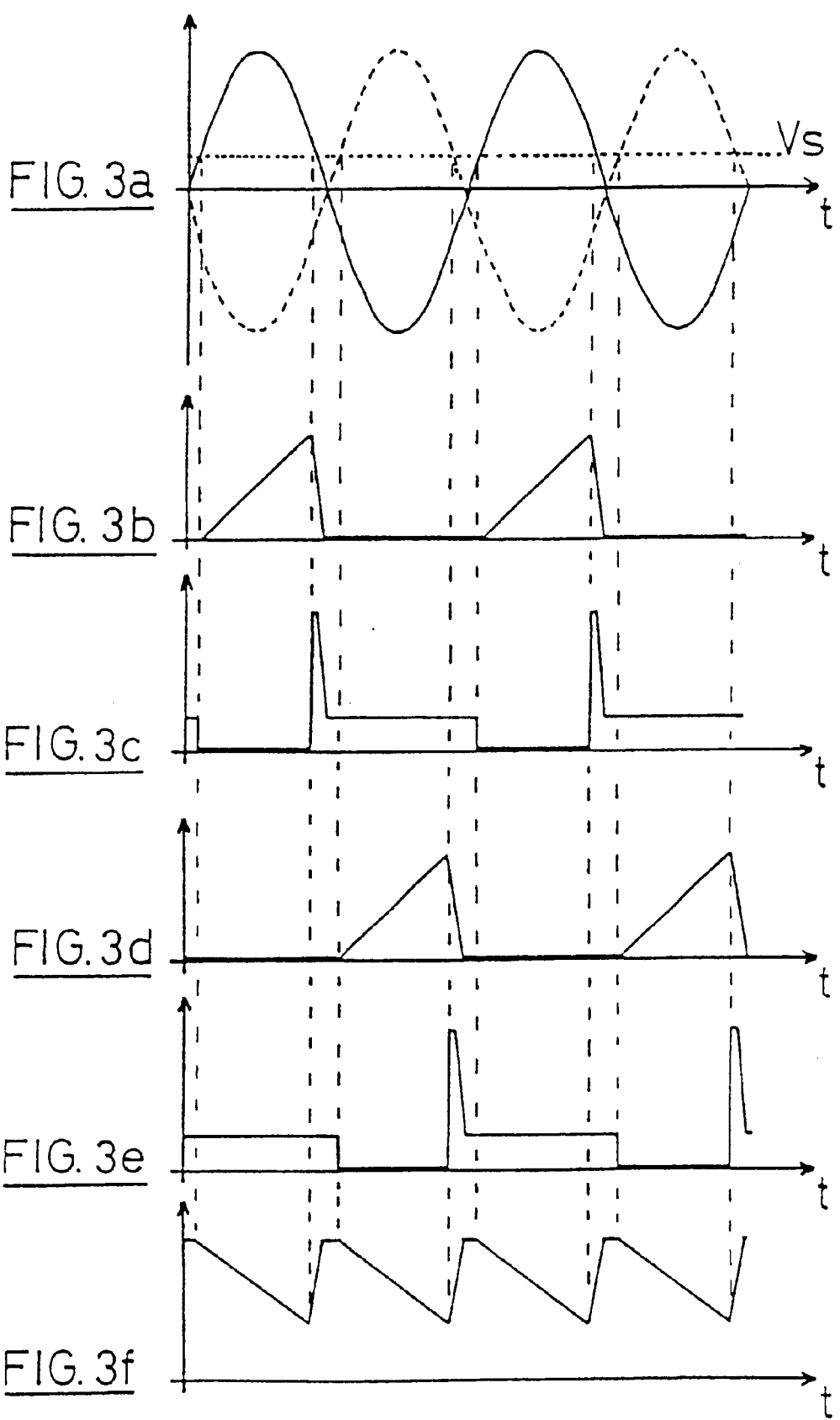
FIGS. 3a–3f are diagrams of functioning of the converter circuit of the FIG. 1.

The advantage of the use of the two chopper-step-up-transformers is that the self-oscillator is, from the energy standpoint, used in its single function of oscillator and that the available alternative voltage is only used for monitoring the chopper-step-up-transformers. FIG. 2 represents a reversible converter that can extract energy provided by a source 21 of very low voltage whose polarity varies. Two converter circuits are antiparallel connected on this source in such a manner to be alternately operating in dependence of the polarity of the source 21. Each of these circuits comprises a JFET transistor 22, respectively 22', a primary 23, respectively 23', a secondary with double winding 20 and 24, respectively 20' and 24', two MOS-FET transistors 25 and 26, respectively 25' and 26', two inductance's 27 and 28, respectively 27' and 28', and two Schottky diodes 29 and 31, respectively 29' and 31' which are connected on the output 32 by the intermediary of switches that will be described hereunder.

The transformer of each converter comprises a supplementary winding 33, respectively 33', whose voltage is sent on a rectifier circuit constituted of two diodes 34, respectively 34', associated with a condenser 35, respectively 35', and whose direct output voltage is applied between the source and the gate of the JFET transistor 22', respectively 22 of the self-oscillating circuit of the other converter in such a way to insure the blocking of the second converter while the first is operating and conversely.

The output voltage of each chopper-step-up transformer is sent on the output terminals, U+ and U−, by the four intermediary switches 39, 41, 38 and 37, MOS-FET transistors, which are connected as a bridge circuit and which are each controlled by the voltage coming from the supplementary windings 42 and 43, respectively 42' and 43', of the transformer of each converter transformer which is rectified by the diodes 44 and 45, respectively 44' and 45', and filtered by condensers.

When the voltage supplied by the source 21 is positive, it is the self-oscillating circuit comprising the JFET transistor 22 that oscillates. As a result, it supplies a direct voltage which insures the conduction of MOS-FET transistor switches 41 and 39. The positive terminal of the chopper-step-up transformer (cathode of the diodes 29 and 31) is thus switched via the drain-source path of the MOS-FET transistor 41 on the output U+. The negative output of the chopper-step-up transformer (sources of transistors 22, 25 and 26) is thus switched via the source-drain path of the MOS-FET transistor 39 to the output U−.

Furthermore, the winding 33 supplies a voltage which, once rectified by the diodes 34 and filtered by the condenser 35, is going to block the JFET transistor 22' of the non-operating self-oscillating circuit whose drain-source resistance was low till that time.

When the voltage delivered by the source 21 is negative, the self-oscillating circuit comprising the JFET transistor 22' is oscillating. The operation is identical to the operation described above. The MOS-FET transistor 38 is going to switch the positive output of the chopper-step-up transformer (cathodes of the diodes 29' and 31') on the output U+. The MOS-FET transistor switch 37 is going to switch the negative output of the chopper-step-up transformer (sources of transistors 22', 25' and 26') on the output U−.

Similarly, a negative voltage supplied by the rectification of the voltage of the secondary 33' is going to block the JFET transistor 22.

The winding 20, respectively 20', constitutes an alternative of the winding 6' of the circuit of the FIG. 1. It allows to operate the self-oscillating circuit with the right winding ratio and allows to increase the control voltage of the MOS-FET transistors of the chopperstep-up transformer for obtaining more clear switches.

According to the mode of realization of the invention, the source of low voltage energy is constituted by an assembly of effect Seebeck detectors placed between a hot thermal source and a cold thermal source whose temperature difference is low, for example some degrees. These two sources can be constituted by the epidermis of the person using an autonomous apparatus and the ambient atmosphere.

Figure 4:
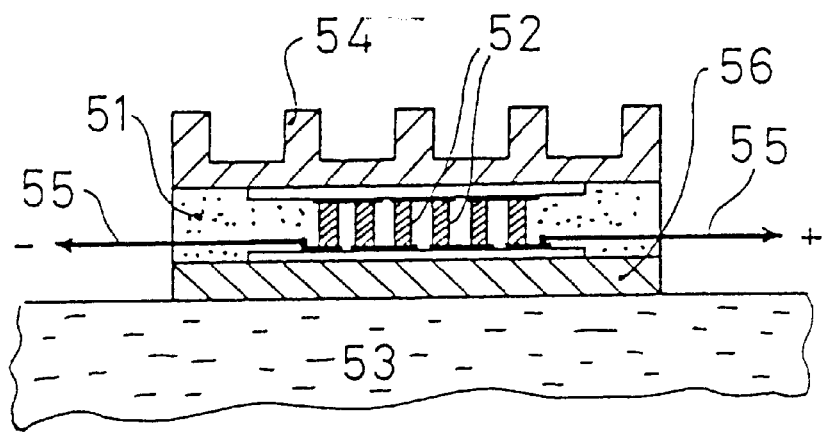
FIG. 4 represents a feeding device from a source of energy of thermal origin.

FIG. 4 illustrates the principle of such a feeding device using heat of animal origin. It comprises a substrate 51 in thermally insulating material in which are placed Seebeck effect detectors 52, in the form of small bars, that is to say of the thermocouple type. Considering the low value of the voltage delivered by such detectors, namely 0.2 mV by Celsius degree (Seebeck coefficient), they are connected in series for obtaining a voltage of 10 to 200 mV. All bars are placed between a collector plate 56 placed directly on the skin 53 of the user and an intersection of heat 54 exchanging the heat with the ambient air. Two electrodes 55 provide the low output voltage for the converter.

Figure 5:
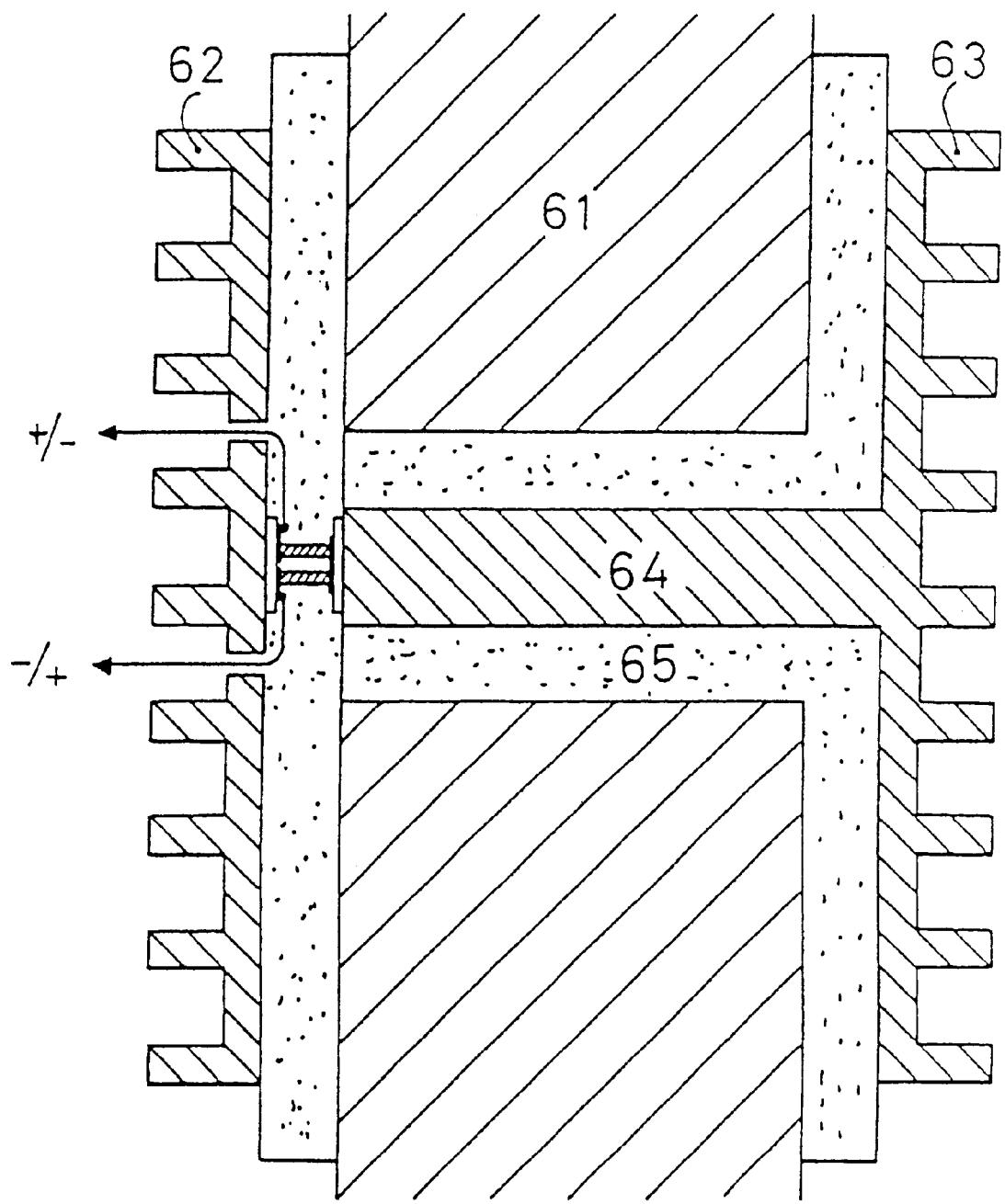
FIG. 5 illustrates the use of a feeding device from a source of energy of thermal origin placed on a wall.

FIG. 5 illustrates the use of a source of thermal origin between the two sides of a wall 61. The Seebeck detectors are placed between a radiator 62 placed inside the room and constituting a heat exchanger with the internal air and an exchanger 63 with the external air which comprises a post 64 crossing the wall 61 in section 65 in thermally insulating material.

Figure 6:
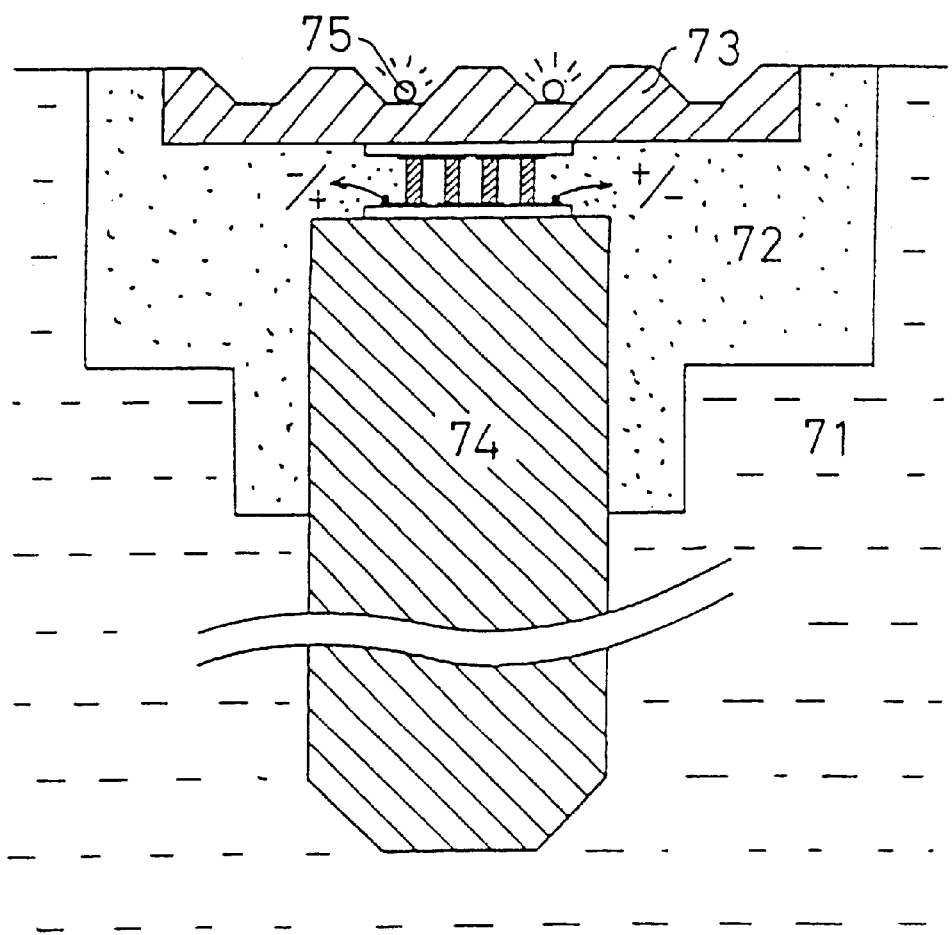
FIG. 6 illustrates the use of a feeding device from a source of energy of thermal origin placed on the ground.

FIG. 6 illustrates the case where one uses the temperature difference with the ground 71. A thermally insulating support 72 is placed in the ground and it comprises a heat exchanger 73 at its upper part. The Seebeck detectors are placed between the lower face of this heat exchanger 73 and the upper face of a thermal collector stake 74 planted in the ground.

This feeding device uses a reversible converter because the temperature difference between the ground and the ambient air is reversed between day and night. This feeding device can for example be used in the domain of the ground road signs. Especially, one can use it to feed a luminous device 75 such as a light emitting diode and to realize a signaled white line.

Figure 7:
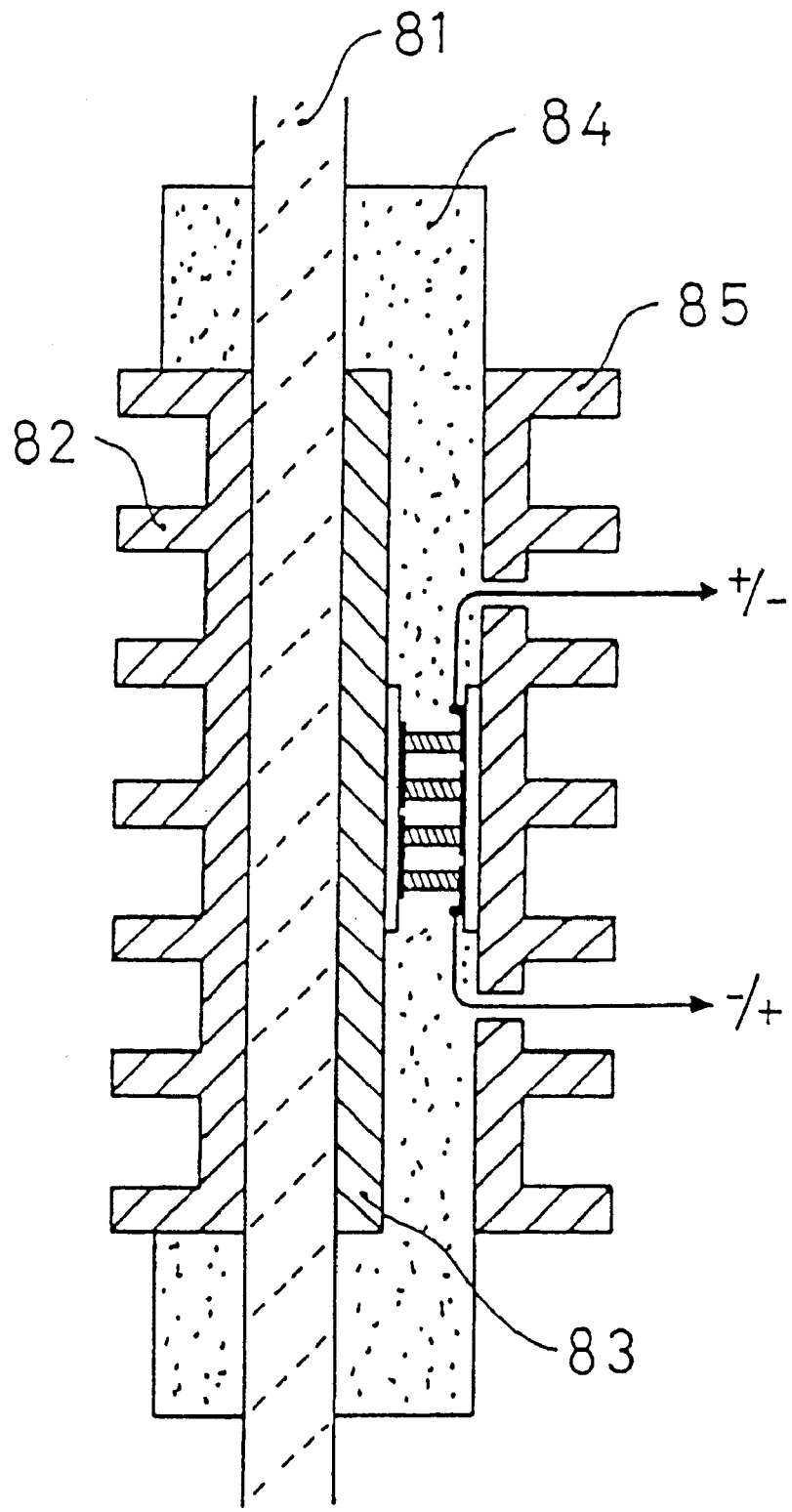
FIG. 7 illustrates the use of a feeding device from a source of energy of thermal origin placed on a pane.

FIG. 7 represents the use of the temperature difference between the two faces of a pane 81. One employs an heat exchanger 82 placed on the external wall of the pane in contact with the external air, a collector plate 83 placed on the internal face of the pane and a heat exchanger 85 placed on a thermally insulating support 84 placed on the internal face of the pane and receiving the collector plate 83. The Seebeck detectors are placed between the collector plate 83 and the heat exchanger 85.

The feeding device of FIGS. 5 and 7 can for example be used for feeding an intrusion detector placed in the vicinity of an opening of a building, such as a window and autonomously operating.

Figure 8:
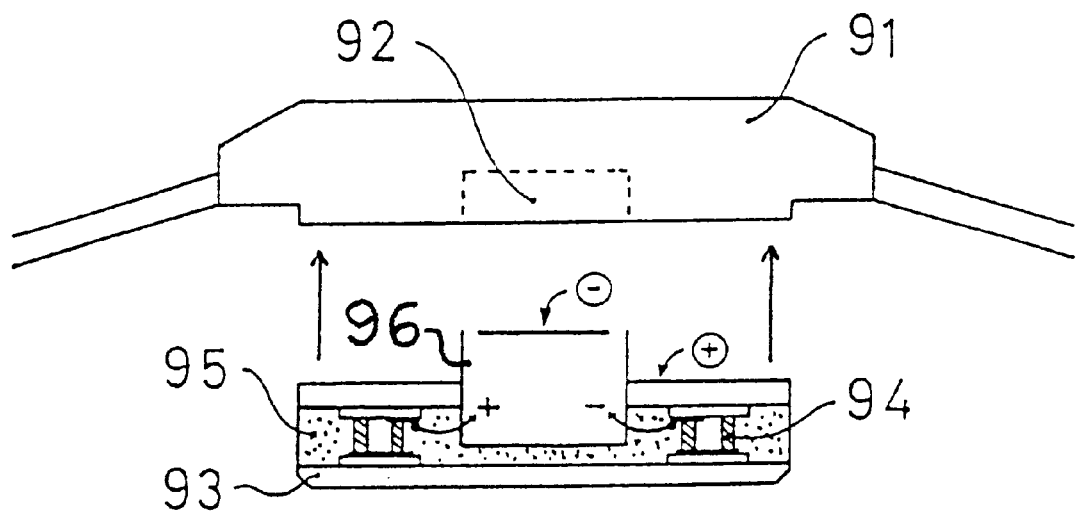
FIG. 8 represents a feeding device according to the invention used in replacement of the cell of a watch.

FIG. 8 is a cross-section of a watch 91 which comprises, in the bottom of its casing, a cell receptacle 92. A feeding device according to the invention is inserted between the skin of the user and the bottom of the casing instead of the primitive closing cap of the watch. It comprises a heat collector bottom 93 on which the Seebeck detectors 94 are placed along a circle by being embedded in a thermally insulating material 95. A receptacle 96 in the form of a cell comprises the electronic circuits and is placed in the cell receptacle 92.

Figure 9:
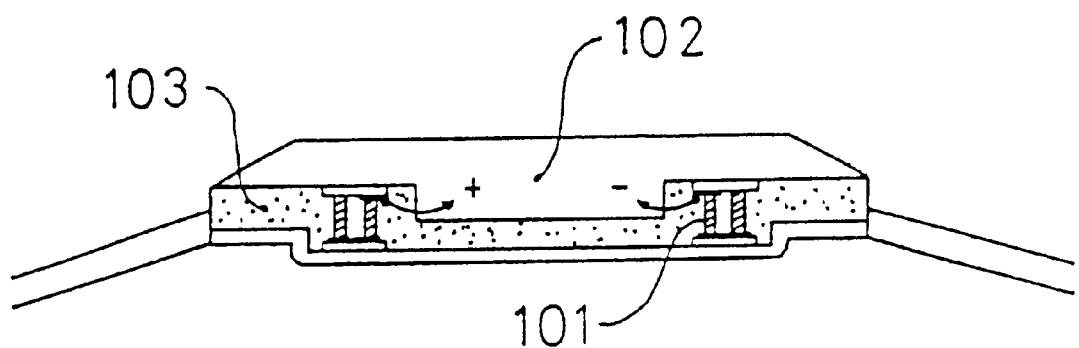
FIG. 9 represents another watch originally equipped with a feeding device according to the invention.

FIG. 9 represents a watch in which the feeding device is integrated in the casing. In this case again, the Seebeck detectors 101 are placed along a ring and the electronic circuit are contained in the body 102 of the watch and embedded in a thermally insulating material 103.

Figures 10, 11:
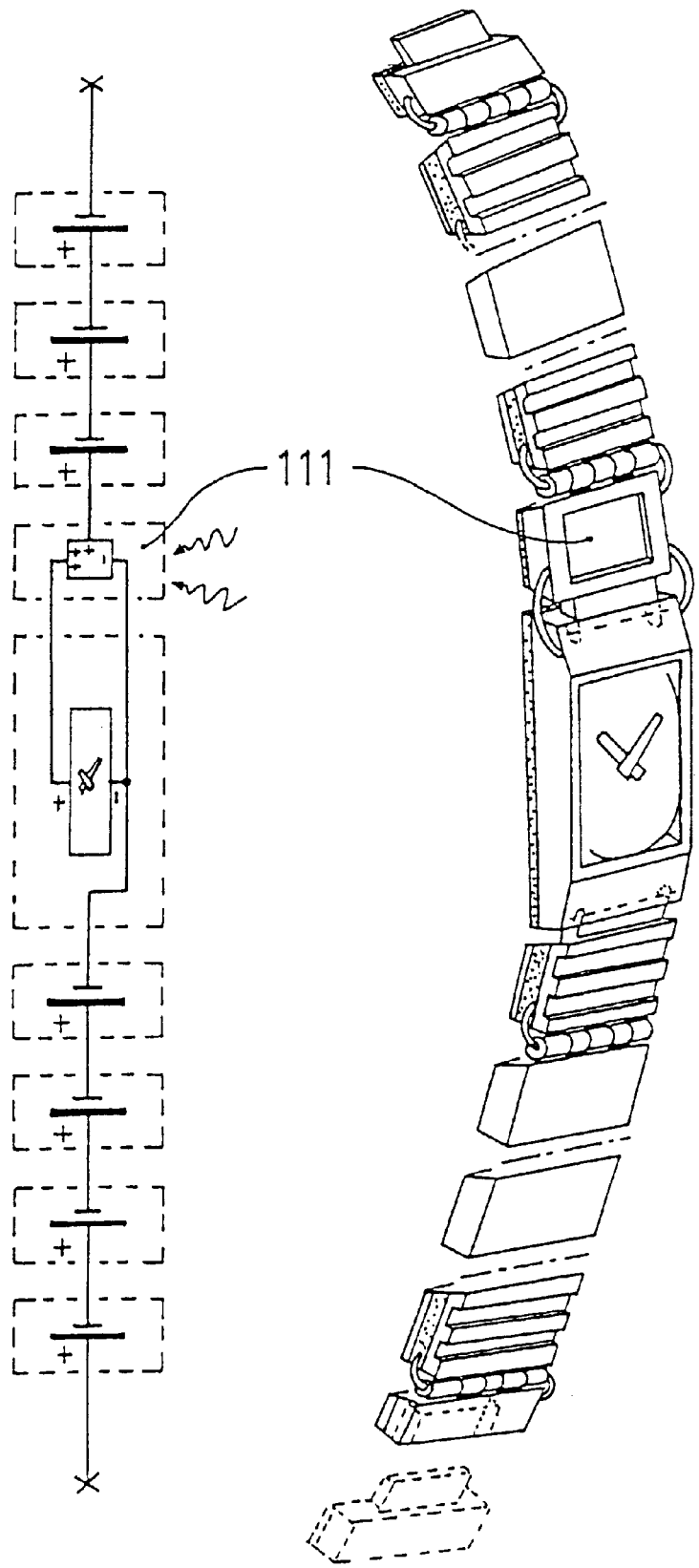
FIG. 10 represents again another mode of realization of a watch according to the invention.
FIG. 11 is the electrical diagram of the watch of the FIG. 10.

FIG. 10 represents a mode of realization of a watch in which, for increasing the exchange surface and, as a result, the power of the source, the Seebeck detectors are placed in the bracelet of the watch which is constituted of articulated links in which are place Seebeck detectors. In this case, a photovoltaic generator 111 is attached on one of the links; it can be directly connected in parallel on the output of the feeding device according to the invention or comprise also a converter circuit. The FIG. 11 indicates the electrical diagram of the totality, the sources constituted by each link being connected in series for constituting the electrical source connected to the converter.

Figure 12:
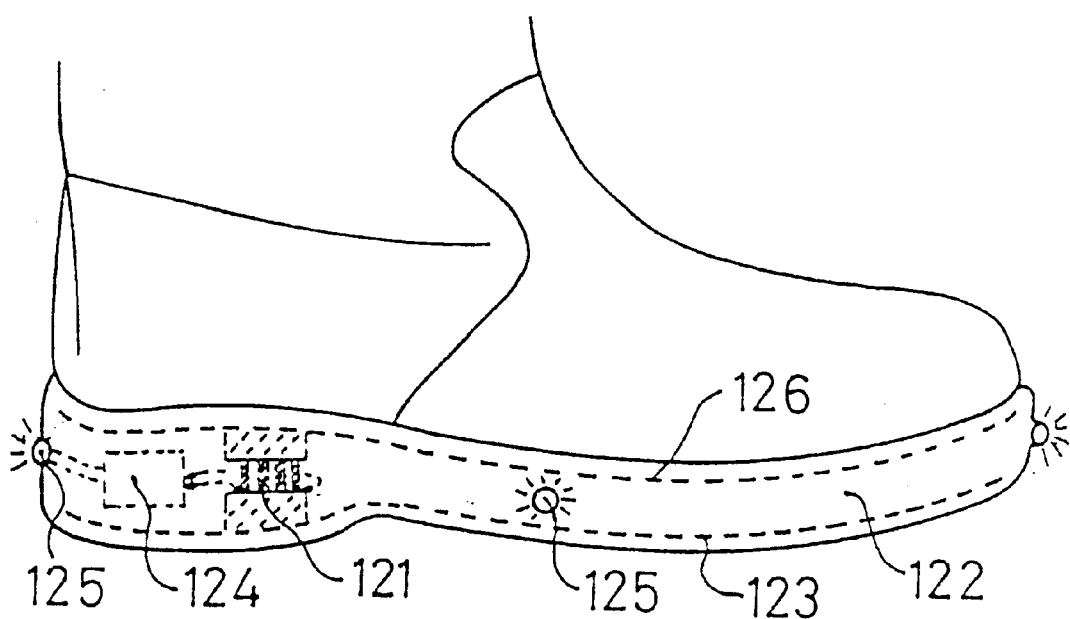
FIG. 12 represents a shoe equipped with a feeding device according to the invention.

FIG. 12 represents the integration of a feeding device according to the invention in an footwear such as a shoe. In this case, the Seebeck detectors 121 are lodged in the sole 122 of the shoe and use the temperature difference between the user's foot and the ground. It is provided with a feet heat exhausting plate 123 which is in contact with the Seebeck detectors as well as a plate 126 collecting the heat of the feet. The electronic circuits 124 are also lodged in the sole 122.

The feeding device can be used for feeding safety devices such as light emitting diodes 125.

In the case of a ski boot, the feeding device can activate a transmitter or a transponder w which allows one to find the user in case of accident such as an avalanche or feed by contact the electronic d device releasing the release binding.

The above description of examples of realization of the invention has been provided only for illustrative and not at all restrictive purpose and one can bring there modifications or alternatives without trespassing the scope of the present invention. Especially, one can use others sources at very low voltage or use several ones in combination.

The reversible converter of FIG. 2 can be used in the case of heat exchanges with the ambient air, for example in the case of FIGS. 5 to 7. This reversible converter allows to provide a feeding when the temperature difference, for example between the earth and the ambient air, is reversed between day and night. One recuperates all possible energy by using the flowing and the flowing back of the heat exchanges.

Furthermore, one can realize an auricular amplifier fed by a feeding device using the temperature difference between the skin and the ambient air and placed in or around the ear.

Such an energy converter efficiently takes advantage of the very low voltages generated at a low impedance by a thermoelectric module using the Seebeck effect, when the later is submitted to a low temperature difference.

It also efficiently takes advantage of the very low voltages generated at a low impedance by a thermoelectric module using the Seebeck effect comprising only some pairs, when the latter is submitted to a high temperature difference.

Such a thermocouple, for example constituted in N and P doped $FeSi_2$, tolerant temperature differences of approximately 700° C., a unique pair generates then between 100 mV and 1 V.

A unique pair can for example contribute to feed a thermometer for measuring high temperatures with an autonomous sensor. The action of the converter at the output of the thermocouple regulates the feeding voltage of the thermometer, the thermometer can for example use the voltage of the thermocouple for measuring the temperature.

A first example of realization of a thermocouple in iron disilicide concerns the measure of the temperature of a food container, a pan, a pressure cooker or a stove for example.

The generation of energy is realized by the $FeSi_2$ device inserted between the wall of the container, which is heated during the cooking, and the sleeve, which acting as a radiator. The converter at the output of thermocouple generates the operating voltage of the thermometer.

This example can also be realized with a thermocouple module with bismuth tellurium such as described in the second part of the specification, instead of the $FeSi_2$ device, since the hot temperature does not exceed 250° C.

A second example of realization concerns the safety of gas ring, whose self-extinction is to the cause of many accidents.

A piezoelectric lighting device is provided for automatically relighting the accidentally blown flame. A couple in $FeSi_2$ a junction of which is in the flame and the other at the temperature of the water of the water delivery pipe constitutes an excellent way for the electrical feeding of the lighting device. The converter circuit makes its functioning secure and simplifies the installation.

A third example of application concerns the electrical generation of a car.

Traditionally ensured by an alternator, the recharge of the battery and the supply of the electrical power are made to the detriment of the propulsion. Nevertheless the thermal engine dissipates much heat which is lost in the environment.

This heat can be converted in electricity at a voltage of 12V by a thermoelectric process. A $FeSi_2$ thermocouple in contact with the exhaust and in contact with the water circuit observes a temperature difference between its faces which can reach 700° C.

A couple is sufficient for generating a usable voltage by the above described converter circuit. A high power version of this circuit would be recommended.

The economy of fuel resulting such a process can reach 20%.

One describes hereafter a mode of realization of a thermocouple module which is used for the low temperature differences, based on bismuth tellurium.

The thermocouples called Peltier or Seebeck effect elements are currently used in the industry for the cooling.

When it is fed by a current, the thermocouple absorbs the heat on one or its faces and rejects it on the other. Operating as a heat pump without mobile part, this device is remarkable by its integration and its reliability more than for its energy efficiency and its manufacture cost.

Submitted to a temperature difference between its collector faces, and energized by a thermal flow, the thermocouple acts as an electrical generator with low impedance, it transforms a part of the thermal flow in usable electrical power. Here also, the generator has a remarkable simplicity but deplores a bad efficiency and a disputable economic profitability.

Thermoelectric modules are traditionally constituted of an electrical circuit including alternately N and P doped semiconducting bars connected in series, these bars undergo in parallel the thermal flow crossing the module.

Traditionally, these vertical bars are aligned in compact ranks in a horizontal plane and sandwiched between two ceramic insulating plates which are supplied with a screen process printed electrical circuit.

A general characteristic of this type of realization is the low electric impedance of the module, direct consequence of the limited number of low electrical resistance bars. It results either the necessity of a low voltage feeding for the generation of cold or the use of a step-up voltage converter at the output of the thermocouple generator.

A second characteristic concerns the difficulty of the integration or of the mounting of this module in a thermal system: since the thermal flow does not cross the interstices, the module has to be glued, compressed or soldered to its thermal drains, this requires precision and to know how and this involves efficiency losses. The modules are in general realized in ceramic, for securing the electric insulation of the circuit and the good conduction of the thermal flow and for avoiding the rupture entailed by dilatation's associated with temperature differences between their faces. It is not possible to solder these modules, the gluing is delicate and the compression necessitates dissipator fittings. Moreover, the thermal drains on which the modules are mounted must have high conductivities or significant dissipations because of the intensity of the flow which crosses the module.

A third characteristic of modules concerns their sensitivity to the corrosion. Indeed, semiconducting bars are generally mounted without protection, so as to limit the thermal losses, they are then exposed to the corrosion.

Finally, the critical characteristic of these modules is their cost.

The cost factors are successively: the price of the thermoelectric raw material, the cost of the transformation, the cost of the cutting in elements, the handling of the miniature elements, the cost of the ceramic material, its cutting, of its serigraphy and of the soldering and finally the cost of the mounting, of the pressing and of the burning of the module.

The invention presents a thermoelectric module which improves the four general characteristics, a process of realization of such modules as well as some examples of applications.

According to the invention, the thermocouples are realized from semiconducting materials with N and P type carriers, electrically connected in series and thermally connected in parallel.

Materials of types P are for example realized from an alloy containing a composition of 77.5% of $Sb_2 Te_3$ in 22.5% of $Bi_2Te_3$ m materials of type N are realized from an alloy comprising 5% $Bi_2Se_3$ in 95% of $Bi_2Te_3$.

According to the invention each material undergoes a vacuum annealing at a temperature of 650° C. during a duration of approximately 12 hours, under a quartz bulb, then a crystallization at a controlled temperature according to the method named THM (Traveling Heater Method), generating a bar of diameter in the order of 30 mm at a speed of approximately 20 mm per day. By this method, it is possible to obtain polycrystal m materials of high thermoelectric quality, whose coefficient of merit Z in the order of $3 \times 10^{-3}$ $K^{-1}$ exceeds that of materials commercialized today ($Z=2.5 \times 10^{-3}$ $K^{-1}$ approximately). Such a material increases the efficiency coefficient of a cooling device by approximately 30% with regard to materials used today. It has an axis A of best efficiency as shown by the axes A of bar materials 201 and 202 of FIG. 13 showing bars of "N" and "P" materials, respectively.

According to the invention, the bar materials are cut into bars 221 and 222 of P and N, mounted and wrapped.

According to a preferred, but not exclusive, mode of realization (FIG. 14), the elementary thermocouple is constituted by a same number of N doped bars 221 and of P doped bars 222 aligned and interleaved to form a rod 220. These bars 221 and 222 have the same dimensions, for example with a squared basis of width L between 0.45×0.45 and 1×1 mm and height H between 1 and 3 mm. The number of bars 221 and 222 will vary in function of the applications between 20 and 400 approximately.

According to the invention, the aligned bars alternately N (221) and P (222) are glued one to the other on their opposite faces. Such a gluing will be realized for example by insertion between each bar of a membrane 223 preimpregnated for a fusible printing or interlining, whose adhesion is insured during a cycle of hot compression.

A Kapton film of low thickness, approximately 25 microns, preimpregnated on a total thickness of 75 microns realizes a durable and solid bridging between each bar, by insuring the electric insulation between them.

The Kapton film, whose thermal conductivity is 10 times lower than the thermoelectric material, entails only a very low thermal bridge between the bars, its influence on the performances is negligible. Moreover the Kapton is a strengthened material, compatible with the epoxy gluing. It consolidates the structure by protecting the bars.

A membrane in glass fibers preimpregnated with epoxy is also appropriate.

According to the invention, aligned bars are wrapped on their sides by a low thickness membrane 224. The latter is glued on its sides, adheres to bars and to the intermediate membranes. These membranes finish consolidating the alignment, protect each bar whose sections 225 only remain apparent.

Such a membrane is for example realized from a glass fibers weaving preimpregnated with epoxy resin or with a Kapton film primpregnated in an epoxy resin.

The Kapton has the advantage of a preslashing only on a single face. The fusible printing for interlining under pressure consolidates and strengthens the structure.

The epoxy glass will be preferred for allowing a formatting of the element before the thermosetting. It appears possible to bend the rod 220 and to give it the indispensable curvature for some mountings. Such a form represented in plan view in FIG. 16 will be imposed before burning, which will coagulate it definitively.

According to the invention, the bars 221 and 222 are electrically connected in series, N P junctions between two successive bars being realized on the upper sections superior, P N junctions on the lower sections.

According to the first mode of realization of the invention, junctions are realized directly on the section of bars, by tracks in nickel 231 FIG. 15 with a thickness of the order of 50 microns approximately. Each joining element has a length slightly inferior to 2×L and a width of L, it insures the junction by totally covering totally the section surface of two successive bars. According to several examples of realization that will be detailed in the description of the process of manufacture, the section is either covered with a layer of chemical nickel with a thickness of 50 microns, sectioned at the appropriate places, or covered with a very thick fastening layer in nickel, on which the track of nickel is tin bismuth 232 soldered, or the section is etched with acid, what only protects the bismuth, which is bismuth soldered with the nickel track.

By this first mode of realization, the electrical circuit in nickel is directly deposited on the sections, what contributes to the protection of the material because the nickel constitutes an excellent chemical barrier and oxidizes only a little.

Figure 17:
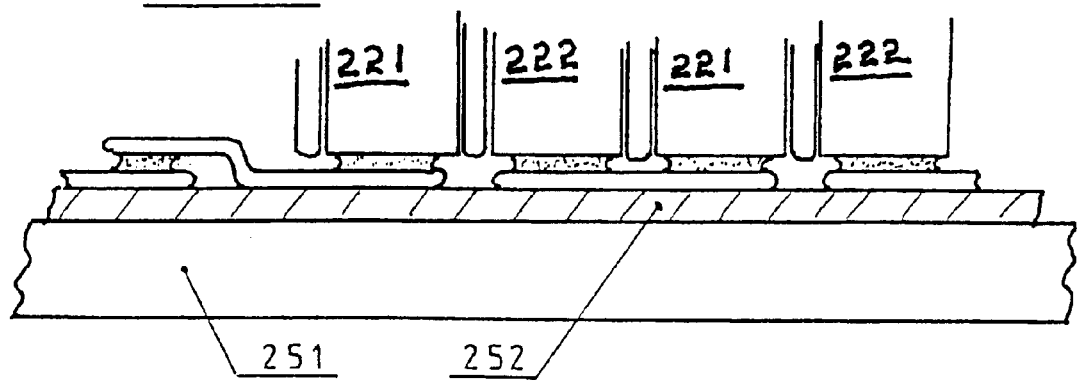
FIG. 17 is a side view of an arrangement showing the rod made of bars glued to a support.

In this first mode of realization, the rod will be preferentially glued to the thermal drains 251 of FIG. 17 during the mounting, according to the usual processes in electronics for dissipating the heat of components towards the circuit on which they rest.

Such a gluing insures an electrical insulation between the component and the support for example metallic and electrically conducting, this quality is indispensable in order that the nickel tracks are not short-circuited. Such a gluing insures a good conduction of the heat to the support because of the intrinsic thermal conductivity of the resin 252 optimized for this application. A good resin presents a conductivity equivalent to that of the thermoelectric material. Finally, the mechanical stability of such a gluing can be optimized by a reinforcement in glass fibers in the resin, insuring a secured strain recovery. An epoxy glue loaded with a conducting ceramic impregnating a fine fiber weaving realizes an optimization of the mechanical stability. Such a gluing realized hot under pressure fixes the rod on the support with a robust anchorage. Since the epoxy resin of the thermal glue melts with the epoxy resin of the membranes, the structure is strengthened and bars are then totally wrapped.

Figure 18:
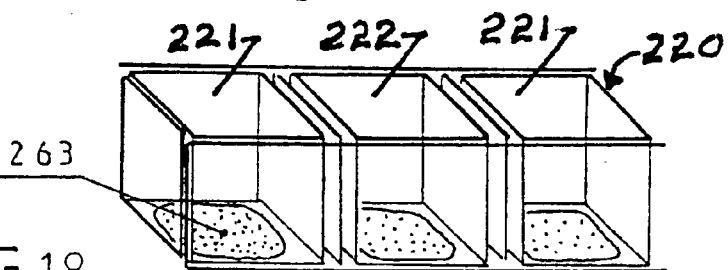
FIG. 18 is a perspective view of a another arrangement showing a rod of bars covered by a distribution barrier.

According to a second mode of realization in FIG. 18, sections of bars 221 and 222 are covered with a very fine layer of nickel acting as a distribution barrier. The rod 220 is secured with tin bismuth 263 brazed on a printed circuit 261 that realizes the joining of the bars by contiguous parallel tracks 262 which are isolated one against the other and spaced by the 2L pitch and whose width is slightly inferior to 2L. These rectangular tracks 262 have a some millimeter length, they are in nickel-plated copper. In this second mode of realization, the printed circuit is formed from a thin "flex" type membrane 264 constituted by a glass fibers weaving impregnated with an epoxy resin loaded with heat conducting elements, such as a ceramic powder, covered with a copper sheet 262 of usual thickness, 35 or 70 microns. It will be taken care to realize an engraving of the copper circuit, then a nickel deposit as scattering barrier, and finally a bismuth pre-tinning.

An example of realization implements a pre-laminated epoxy glass loaded with boron nitride glued on a copper strip. The serigraphy and the engraving of the copper define the circuit, it is then brazed after nickel-plating on the bars.

In this second mode of realization, the printed circuit is glued on metallic pieces acting as thermal drains 265, in aluminum, copper, tin, sheet steel, nickel steel, invar or stainless steel according to the application, or the circuit is integrated, to a classic circuit provided with copper plane dissipators and for example with coppered passages for the heat transfer.

Printed circuits of the stratified type copper on aluminum suit particularly to the application, after nickel-plating of the copper.

In this mode of realization, the rod is sandwiched between two such circuits and hot pressed for consolidating both the soldering and the epoxy glue.

It has been described two examples of realization of the elementary thermocouple elementary in the form of a rod constituted by a row of alternately N and P doped bars. In one case, the electrical circuit is realized in nickel on the rod supplied with connectors at its extremities, in the other case, the circuit is realized on the support, under the form of a printed circuit, on which is the rod is brazed.

In both cases, the rod is hot pressed preferably between the support acting as a lower thermal drain and the upper thermal drain.

A cold pressing with a polymerizable thermal glue is also possible.

Another example of realization of the module is constituted by multiple attached rods for constituting a block whose dimensions are in the order of $10 \times 10 \times 2$ mm$^3$. Its constitution is the same, its characteristics are similar.

According to the invention, the elementary component presents elementary characteristics of electrical impedance, thermal, power of cold, as well as useful section corresponding to the section of its basis.

The modes of mounting of these elementary thermocouples rods facilitate their integration in thermoelectric cooling systems or thermoelectric generators, because it allows to match the density and the number of elementary modules with the thermal and electrical characteristics of the interfaces.

Especially, an usual thermocouple presents a significant thermal conductivity, and potentially and important flow, entailing sometimes the necessity to dissipate heat and cold by large finned radiators and in forced state.

A lesser thermoelectric matter density allows the example to distribute the thermocouples with a lesser cost on an important surface and, therefore, to have larger exchange surfaces without ventilation or cumbersome fins. That simplifies the transportation of the heat. By this process, hot and cold faces can be only very simple single aluminum plates isolated one against the other by a self adhesive foam placed around the components.

In the thermogeneration, the temperature differences are reduced, the dissipated powers are weak, as well as the densities of rod.

According to the invention, we describe a first example of realization of a cooling device for example destined for a mini-refrigerator.

Such a device comprises an internal cold face, an external hot face, and, optionally, of a heat exchanger.

Depending of the performances, the hot external face dissipates approximately twice the heat drawn in the cold part. Therefore sometimes, there is provided an artificial ventilation whose principle is described hereafter.

Figure 19:
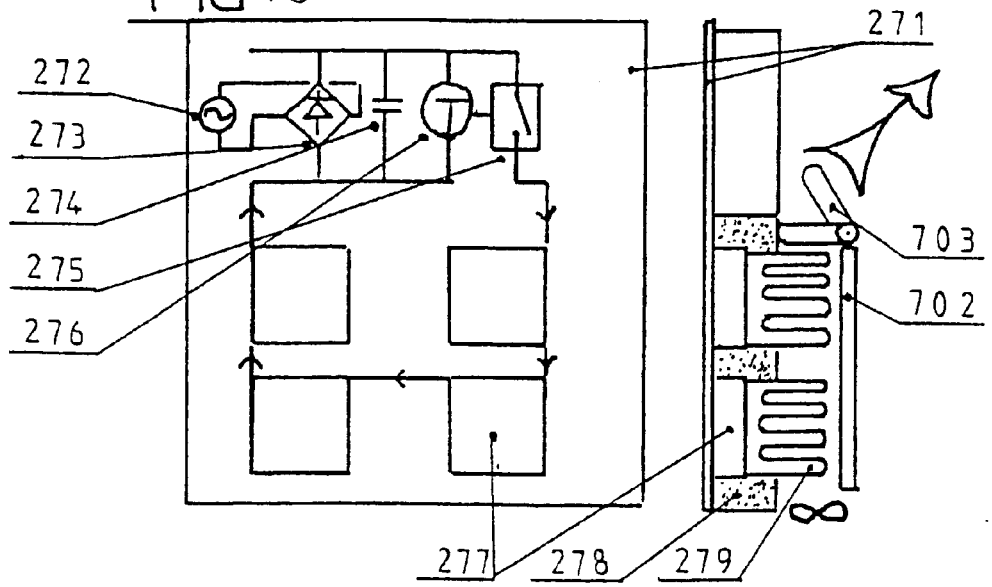
FIG. 19 is a schematic of a cooling system.

The cold face 271 of FIG. 19 constitutes the structure of the cooling system. It is realized from of a laminated printed circuit nickel-plated copper on aluminium. On the aluminium is laminated a sandwich constituted of a glass fibers layer preimpregnated to the thermal conducting resin, and of a copper layer copper forming the desired electrical circuit 272.

The electrical circuit is distributed in two zones:

A first zone in which the feeding and regulation device is implanted, a second zone forming the thermoelectric circuit.

The feeding and regulation circuit is realized from components to mounted in the surface, implanted in the first zone. It is constituted of a simple diode rectifier, of a condenser 274 and of a multiple relay 275 controlled by the integrated thermostat 276.

The thermocouple rods 277 are soldered with tin bismuth and implanted in the zone of the thermoelectric circuit, according to a series-parallel diagram. The mounting process is in accordance with the standards of the CMS components.

A layer of thermal adhesive foam 278 fulfills all the residual volume between the components, on a height of in the order of L.

Finally, a mosaic of thermal dissipators 279 are covering the zone of the thermocouple rods, each dissipator supplied with a laminated copper-tin circuit is soldered on between from 2 to 4 rods, and for example consolidated in its center by a stainless steel rivet.

These dissipators 279 are for example realized in extruded aluminum.

According to a not exclusive mode of realization of the invention, an optional ventilator 701 realizes a forced dissipation in a tunnel 702 around the blades of the dissipators. This ventilator is released in parallel with the thermocouples, under the control of the thermostat. Associated with the tunnel of ventilation and the ventilator, two valves 703 seal, under the effect of their mass, the entries and exits of the tunnel, so as to reduce to the maximum the effect of insulation loss when the relay is opened, consequence of the thermal conductivity of the cells. These valves open just at the activation of the ventilator and the thermocouples.

An insulating wall 702 and 278 contributes to strengthen the insulation, particularly around the tunnel of ventilation.

Such a process is usable for mini-refrigerators, for mini-air conditioners, for cooling systems of industrial or food liquids, (in this particular case, the cold wall 271 is in contact with a fluid heat exchanger), for stalls of butchery, etc.

This device optimizes the bulkiness and the cooling efficiency, as well as the insulation. Indeed: it presents a great exchange surface for the cold face, therefore it authorizes an only convective exchange without ventilator and without bulkiness, it concentrates moderately the flow on the hot face, and it is possible to condition, during the functioning of the thermocouples, the thermal exchange with the outside by forced ventilation.

Moreover, the feeding circuit is implanted in a surface that is lost for the cooling without further expense.

For an application of this type, one will prefer square modules of about 10×10 mm$^2$ constituted of joined rods, each pumping approximately I watt on a surface of 10 cm$^2$.

According to the invention, we describe on FIG. 20 an example of electrical microgenerator in the form of a link of bracelet.

The heat collect is realized in laminated aluminum copper 281 whose copper 282 is nickel-plated or in printed circuit.

The dissipator is realized in laminated aluminum copper 283 whose copper 284 is nickel-plated. This dissipator represents the upper face of the bracelet and comprises small fins 285.

On both sides of the link, as well as on the central zone, rods of about 10 mm of length are brazed between the collector and the dissipator. At each end of the link, a nickel-plated pivot 287 is brazed on the internal face of the dissipator or on the internal face of the collector, it insures the electrical continuity from link to link thanks to a conducting axle.

A rivet or a stainless steel screw contributes to consolidate the link by exerting a pressure on the brazing.

A foam (not shown) insures the protection and the cleanness of the link, as well as the insulation between the two faces.

At the wrist, the temperature difference between the collector and the dissipator induces a thermal flow which is converted into back-electromotive force collected between the pivots.

With approximately 20 pairs N P per link and a temperature difference in the order of 10° C. between the faces, each link with a surface of 2 cm$^2$ generates a potential difference of the order of 20 mV, under an impedance of 2.4 ohms, i.e. approximately 80 microwatts maximum delivered.

This constitutes a not exclusive example of implementation of optimized thermogenerator. The output voltage is proportional to the difference of temperature between collector faces and dissipator faces and to the number of N P couples, and, moreover, the delivered electrical power is maximum when the thermal resistance of the bars is equivalent to that of the dissipator, the total section of the authorized thermoelectric matter is therefore determinated. The maximum voltage is obtained for bars whose ratio H/L$^2$ is maximum.

For a low section and great length the bars are fragile, and the reinforcement by membranes contributes to render the optimization the factor H/++L2 possible.

These two implementations of elementary modules in the form of rods are not limitative and the given examples develop their simplicity.

According to the invention, we describe a process of realization of a rod module.

Each rod contains an alternation of P and N doped thermoelectric materials. These materials undergo a crystal-line growth and present an anisotropy axis A FIG. 13 of the thermal conductivity and of the factor of merit.

According to the invention, original N and P ingots are rectangular, elongated along the anisotropy axis.

Ingots are then cut in parallel slices containing the anisotropy axis, with a thickness close to L. Such a cutting is for example realized with a multiple disk circular saw or with a disk saw.

The slices 291, 292 of FIG. 21 are then alternated P and N by maintaining parallel axes, superposed, by inserting in each slice a thermo-adhesive membrane 293 of low thickness. This membrane is for example a Kapton of 25 micron comprising on both sides 25 micron of epoxy resin, or well an epoxy glass.

The reconstituted ingot is therefore a composite constituted of an alternation of a N P electrically isolated slices.

A first burning insures a partial polymerization, under pressure, at temperature close to 130° C.

After processing, the new ingot is then cut again in slices of approximately L thickness according to planes containing the anisotropy axis and perpendicular to the preceding slices.

Each slice 2101 of FIG. 22 containing rectangular stems of section L$^2$ alternately in N and P material is then covered on both sides by two membranes in Kapton 2102, 2103 pre-glued only on one face. The slices are then superposed and the ingot reconstituted. One realizes thus rods, because slices are not glued one to the other. It is also possible to cover slices with epoxy glass, and to separate them by a stripping membrane in pacothane. The latter will authorize the separation of the rods.

Finally, for realizing module blocks, one will insert between the slices only one membrane in Kapton pre glued on its two faces or a membrane in epoxy glass. One will take care to alternate the N and P bars for obtaining a checked distribution.

A cycle of burning under the pressure finished the polymerization of the slices.

Figure 23:
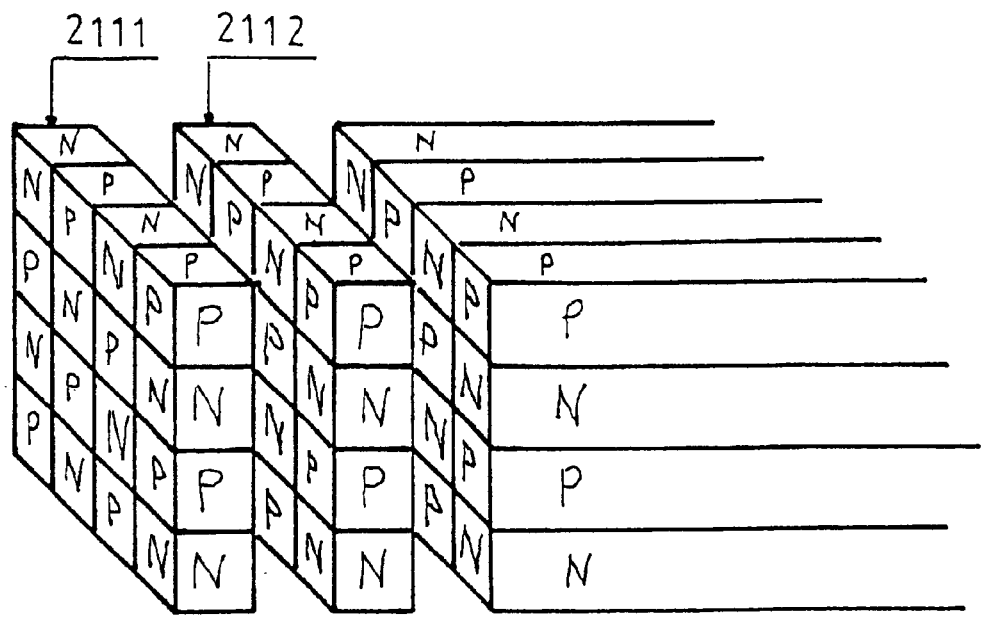
FIG. 23 is a perspective view showing the ingots sliced into sections of bars.

The ingot is then cut according to the perpendicular plan to the anisotrophy axis in slices of thickness H, 2111, 2112, FIG. 23, each slices showing the sections of the bars.

Each slice contains the elementary N P rods, the rods are juxtaposed and are linked by the residual adherence. A shearing dissociates them.

The modules remain in block.

Figure 24:
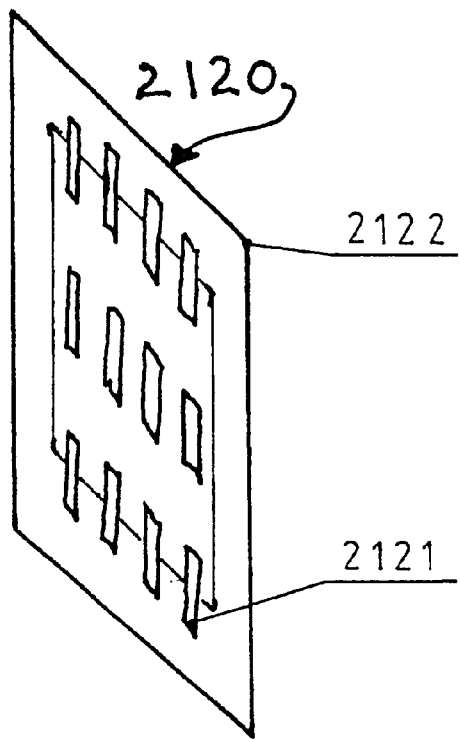
FIG. 24 is a perspective view of a section of a thermo-element according to the present invention.

The slice of FIG. 24 presents the sharp sections of the thermoelements, it is protected by a deposit of nickel, electrochemical or chemical, in a bath. The nickel acts as a distribution barrier and adhesive interface for the brazing.

Several alternatives appear.

The deposited nickel layer has a high thickness, approximately 0.1 mm and it insures a continuous recovery of the slice, with robust fastening of the bars. Then, by cutting or selective chemical etching, it is possible to realize directly the connections between the bars, then to separate the rods supplied with their proper electrical circuit. A flash by sputtering contributes to release the fastening before the chemical deposit. The bar is destined to be glued with the thermal glue.

The layer of nickel has a low thickness, as is seen in FIG. 24. The slice 2120 is nickel-plated on the section of bars exclusively. Then it is possible to braze under hot press a flexible circuit in copper tin bismuth 2121 pre-welded on a membrane in epoxy glass loaded with boron nitride. A phase of pressing at the temperature of brazing of the slice solders the junctions. The circuit will have been preliminary engraved by serigraphy on the copper bound with an adhesive transparent leaf 2122 in loaded epoxy glass. Each rod realized by this process comprises two weldable strips, the rods are separated by cutting of the membrane in loaded epoxy glass.

The layer of nickel is fine, the rod is destined to be welded on a printed circuit that insures the junctions between the elements. The printed circuit is in nickel-plated copper bismuth. A stratified nickel-plated copper-aluminum constitutes the best technical alternative.

It has been described a thermoelectric module under the form of a multi-element rod, mounting version of this rod either by gluing, or by brazing, the integration of this rod in a thermal and electrical circuit, two examples of implementation of such elements for a device of refrigeration and for a microgenerator, and finally, a process of realization of such rods minimizing the cut and manipulation operations.

An assembly of rods constitutes a block whose applications are similar.

The rod presents as announced

- an optimization of the electrical impedance, consequence of the optimization of H/L2 and of the number of bars.
- an optimization of the thermal impedance: The rod comprises an elementary thermal conductivity, the very simple association of the bars in series electrically and parallel thermally allows the matching of the thermal resistance of the rods to that of the associated preexisting thermal drains and dissipators.
- a mechanical resistance improved by the fact of the composite structure.
- a resistance to the corrosion improved by the fact that each element is totally coated in either resin, or nickel.
- a simplification of the mounting, by the implementation of technics similar to those used in CMS.

The process of realization is optimized in term of cost by the fact that it suppress the following elements:

- individual bars cutting
- handling individual bars
- brazing on ceramic support
- the mounting is less expensive, because it is limited to a hot gluing or to a brazing on printed circuit with dissipative support.

What is claimed is:

1. A thermoelectric component of bismuth tellurium doped with antimony and bismuth tellurium doped with selenium, comprising parallelepipedic bars of thermoelectric material which are joined to one another (221, 222), coated on their faces opposite to an electrically and thermally insulating membrane (223);

mechanically strengthened on their flanks by an electrical and thermal insulating membrane (224), and covered on their apparent faces (225) with a thin electrical circuit, to insure the electrical series connection of the bars.

2. A thermoelectric component according to claim 1 comprised of a row of alternately P and N doped bars configured as rod, glued one on the other on opposite faces by a membrane for fusible printing for interlining, embedded by a lateral strengthened membrane, nickel-plated on the apparent faces of the bars, then brazed to an elementary thin circuit insuring the junction of a bar with an adjacent bar.

3. A thermoelectric component according to claim 1 configured as a parallelepipedic module constituted by the juxtaposition of several elementary components electrically connected in series and crossed in parallel by the thermal flow.

4. A thermoelectric component of claim 1 in combination with a generator of cold temperatures comprising an aluminum plate covered with a thin electrical circuit insuring the connection between components, components being fusion printed for interlining to the plate or brazed and the components being covered by several dissipaters under an air flow driven by a ventilator.

5. A thermoelectric component of claim 1 in combination with thermoelectrics generator which comprises components inserted between a collector at a selected temperature (281) and a dissipater at a different temperature (285), an electrical connection circuit being disposed between the components (282).

6. A process of realization of the component according to claim 1, characterized in that the original materials, in the form of two bars, one doped with selenium, the other with antimony, undergo a first cycle of cutting in slices, then a reconstitution of the bar with interleaving of membranes for fusible printing for interlining, with alternation of the materials form one slice to the other, then a hardening of the reconstituted bar, then a cutting in slice in a perpendicular plan, then a reconstitution with interleaving of membrane, and hardening, and finally a third cycle of cutting in the axis perpendicular to that of the bars, realizing components without electrical circuit.

7. A thermoelectric component of claim 1 in combination with a voltage generator for feeding a thermometer measuring the temperature of a culinary container comprising at least a thermocouple in iron disilicide or a thermocouple module one or the other of which are inserted between a sleeve and a container and is connected to a converter circuit.

8. Voltage generator for feeding a thermometer measuring the temperature of a culinary container, characterized in that it comprises at least a thermoelectric couple in iron disilicide or a thermocouple module according to claim 1, one or the other being inserted between the sleeve and the container, and connected to a converter circuit which boosts the voltage provided by a source (1; 21) at low direct voltage with a small internal resistance (2), comprising a self-oscillating circuit, functioning at a very low voltage, using a voltage step-up transformer (3, 4, 6, 6', 7; 20, 23, 24, 20', 23', 24') generating the control signals of two chopper-step-up transformers (11–14; 25'–28") with alternate operation, comprising an enhancement mode field effect transistor (11, 12; 25, 26, 25', 25') which is used as a synchronous switch with the self-oscillating circuit, which is connected in series with an inductance (13, 14; 27, 28, 27', 28') to the terminals of said source (1,; 21) and which is connected to the user circuit through a diode (15, 16; 29, 31, 29', 31').

9. A thermoelectric component comprising:

bismuth tellurium bars (222 and 221) doped with antimony and bismuth tellurium bars doped with selenium, the bars providing a rod (220) made of alternating P and N doped bars (222 and 221), respectively;

the bars (222 and 221) being joined to one another at opposing faces in a alternating array by electrically and thermally insulating membranes (223);

the bars being mechanically strengthened along at least one set of coextensive side faces by an electrically and thermally insulating membrane (224), and the bars having nickel plated apparent faces (225) that have bismuth tin plated membranes (263) that form a brazed connection with engraved copper nickel plated tracks (262) insuring junction of adjacent bars (222 and 221), the engraved copper nickel plated tracks (262) being bonded to a thin electrical circuit (261) realized from a thin epoxy glass membrane (264) loaded with boron nitride.

10. A thermoelectric component made of bismuth tellurium bars (222 and 221) doped with antimony and bismuth tellurium bars doped with selenium, to provide a rod (220) made of alternating P and N doped bars (222 and 221) respectively;

the bars (222 and 221) being joined to one another at opposing faces in a alternating array by electrically and thermally insulating membranes (223);

the bars being mechanically strengthened along at least one set of coextensive side faces by an electrically and thermally insulating membrane (224), the bars having nickel plated apparent faces (225) that have bismuth tin plated membranes (263) that form a brazed connection with engraved copper nickel plated tracks (262) insuring junction of adjacent bars (222 and 221); and the electrically insulating and thermally conducting membrane (252, 264) being made of a copper engraved nickel-plated and bismuth tin plated material and the electrical circuit being realized on a rigid thermally conducting support (251, 265) covered with the electrically insulating and conducting membrane (252, 264).

11. A thermoelectric component, comprising:

first parallelepipedic bars of bismuth tellerium doped with antimony to provide a P material;

second parallelepipedic bars of bismuth tellurium doped with selenium to provide an N material;

an electricallly insulating, thermoplastic film disposed between opposed facing surfaces of the bars and adhered by heat to the opposed surfaces to join the bars together at the opposed faces thereof;

the film being relatively thin and having relatively low thermal insulation properties to facilitate heat transfer between adjacent bars;

electrically insulating membranes extending transverse to the films adhered to first adjacent, non-facing surfaces of the bars to mechanically strengthen the rod and to hold the bars in alignment, the electrically insulating membranes being relatively thin, and a thin electrical conductor adhered to second adjacent non-facing surfaces of the bars for providing a series electrical connection between the bars.

12. The thermoelectric component of claim 11, wherein the film is made of a polyflouride material.

13. The thermoelectric component of claim 11 wherein the total thickness of the film material between opposed facing surfaces is in the range of 25 to 75 microns.

* * * * *